United States Patent
Yang

(12) 
(10) Patent No.: US 6,291,292 B1
(45) Date of Patent: Sep. 18, 2001

(54) METHOD FOR FABRICATING A SEMICONDUCTOR MEMORY DEVICE

(75) Inventor: Bee Lyong Yang, Kyoungki-do (KR)

(73) Assignee: Hyundai Electronics Industries Co., Ltd., Ich'on (KR)

(*) Notice: Subject to any disclaimer, the term of this patent is extended or adjusted under 35 U.S.C. 154(b) by 0 days.

(21) Appl. No.: 09/425,557

(22) Filed: Oct. 22, 1999

(30) Foreign Application Priority Data

Oct. 24, 1998 (KR) .................................................. 98-44736

(51) Int. Cl.$^7$ ................................................ H01L 21/8242
(52) U.S. Cl. ............................... 438/241; 438/3; 438/240; 438/256
(58) Field of Search .................................. 438/241, 256, 438/253, 3, 396, 399, 239, 240

(56) References Cited

U.S. PATENT DOCUMENTS

| | | | |
|---|---|---|---|
| 5,155,573 | 10/1992 | Abe et al. | 357/51 |
| 5,158,901 * | 10/1992 | Kosa et al. | 148/DIG. 53 |
| 5,326,721 | 7/1994 | Summerfelt | 437/131 |
| 5,426,075 | 6/1995 | Perino et al. | 437/235 |
| 5,538,941 | 7/1996 | Findikoglu et al. | 505/210 |
| 5,543,386 | 8/1996 | Findikoglu et al. | 505/210 |
| 5,572,052 | 11/1996 | Tashihara et al. | 257/295 |
| 5,589,284 | 12/1996 | Summerfelt et al. | 428/697 |
| 5,604,375 | 2/1997 | Findikoglu et al. | 257/661 |
| 5,721,194 | 2/1998 | Yandrofski et al. | 505/210 |
| 5,742,076 | 4/1998 | Sridevan et al. | 257/77 |
| 5,760,432 | 6/1998 | Abe et al. | 257/295 |
| 5,798,903 | 8/1998 | Dhote et al. | 361/321.4 |
| 5,825,055 | 10/1998 | Summerfelt | 257/183 |
| 5,854,104 * | 12/1998 | Onishi et al. | 438/3 |
| 5,858,851 * | 1/1999 | Yamagata et al. | 438/253 |
| 5,877,977 | 3/1999 | Essaian | 365/145 |
| 5,889,299 | 3/1999 | Abe et al. | 257/295 |
| 6,184,927 * | 2/2001 | Kang | 438/396 |
| 6,204,070 * | 3/2001 | Kim | 438/3 |
| 6,204,158 * | 3/2001 | Hendrix et al. | 438/3 |

FOREIGN PATENT DOCUMENTS

| | | | |
|---|---|---|---|
| 06196648 | 7/1994 | (JP) . | |
| 09232532 | 9/1997 | (JP) | H01L/27/108 |

* cited by examiner

*Primary Examiner*—Michael Trinh
(74) *Attorney, Agent, or Firm*—Finnegan, Henderson, Farabow, Garrett & Dunner, L.L.P.

(57) ABSTRACT

The present invention discloses a ferroelectric memory device and a method for fabricating the same. The semiconductor memory device is fabricated by a method comprising the steps of: forming source and drain regions at selected portions of a semiconductor substrate in which an active region is defined; forming a plug contacted with the source region by growing the semiconductor substrate according to an epitaxial method; forming a gate electrode between the source and the drain regions; forming a first intermetal insulating layer on the semiconductor substrate; forming a bit line contacted with the drain region by penetrating the first intermetal insulating layer; forming a second intermetal insulating layer on the first intermetal insulating layer in which the bit line is formed; polishing the first and the second intermetal insulating layers until a surface of the plug is exposed according to a chemical mechanical polishing process; growing a glue layer and a conductive layer for lower electrode successively according to epitaxial method by taking the plug as a seed; forming a lower electrode by patterning selected portions of the conductive layer for lower electrode and the glue layer; forming a protection layer for surrounding surfaces of the intermetal insulating layers and sidewalls of the glue layer, the lower electrode, the metal oxide type electrode, and simultaneously exposing the surface of the metal oxide type electrode; growing a dielectriclayer and a conductive layer for upper electrode on the lower electrode according to the epitaxial method; and forming an upper electrode by patterning selected portions of the conductive layer for upper layer and the dielectric layer, wherein the dielectric layer is formed of a layer selected among ferroelectric layer, high dielectric layer or pyroelectric layer.

24 Claims, 4 Drawing Sheets

METHOD FOR FABRICATING A SEMICONDUCTOR MEMORY DEVICE

FIELD OF THE INVENTION

This invention relates to a method for fabricating a semiconductor memory device, and more particularly to a semiconductor memory device and a method for fabricating the same where a ferroelectric film, a high dielectric film or pyroelectric film is used as a capacitor.

BACKGROUND OF THE INVENTION

In general, a ferroelectric random access memory (FeRAM) device is nonvolatile and the data stored in the FeRAM device are not removed in power off. However, if the thickness of the capacitor is very thin, switching polarization is occurred fast so that the FeRAM device is able to read out the data therefrom or write the data therein with high speed and low voltage. The FeRAM device may constitute memory cells in which each memory cell is comprised of a transistor and a ferroelectric capacitor so that it is applicable to semiconductor memory device with high density. There are typically $SrBi_2Ta_2O_9$(SBT), $Pb(ZrTi)O_3$ (PZT) as ferroelectric films, $(Ba,Sr)TiO_3$ as a dielectric film, and $PbTiO_3$ and $(Pb,La)TiO_3$ as pyroelectric films respectively.

FIG.1 is a cross-sectional view for illustrating a method for fabricating the semiconductor memory device.

Referring to FIG. 1, in order to define an active region, a field oxide layer 11 is formed on a selected portion of a semiconductor substrate 10. A gate insulating layer 12 and a conductive layer 13 for gate electrode are successively deposited at the active region of the semiconductor substrate 10. Selected portions of the conductive layer 13 for gate electrode and the gate insulating layer 12 are patterned thereby forming a gate electrode 14. Impurities are ion-implanted to both sides of the gate electrode 14, thereby forming source and drain regions 15a, 15b. Then, a transistor is completed. A first intermetal insulating layer 16 is deposited on the semiconductor substrate 10 in which the transistor is formed, and the first intermetal insulating layer 16 is etched to expose the drain region 15b thereby forming a contact hole within the first intermetal insulating layer 16. So as to contact with the exposed drain region 15b, a bit line 17 is formed within the contact hole and on the first intermetal insulating layer 16. A second intermetal insulating layer 18 is formed on the first intermetal insulating layer 16 in which the bit line 17 is formed. The second intermetal insulating layer 18 and the first intermetal insulating layer 16 are etched to expose the source region 15a of the transistor thereby forming a contact hole. Next, a plug 19 is formed such that the contact hole is buried. The plug 19 is formed of polysilicon material. A glue layer 20, a metal film 21 for lower electrode, a dielectric layer 22 and a metal film 23 for upper electrode are successively deposited on the plug 19 and the second intermetal insulating layer 18. The metal film 23 for upper electrode, the dielectric layer 22, the metal film 21 for lower electrode and the glue layer 20 are patterned to contact with the plug 19 thereby forming a capacitor 24. The dielectric layer 22 can be formed of ferroelectric film, high dielectric film or pyroelectric film.

However, since the plug 19 connecting the source region 15a and the capacitor 24 is made of polysilicon, layers formed on the plug 19, i.e. the glue layer 20, the metal film 21 for lower electrode, the dielectric layer and the metal film 23 for upper electrode have polycrystalline structures. Thus, volatile components i.e. Pb, Bi, O in the dielectric layer 22, are diffused to the metal film 21 for lower electrode and the glue layer 20 through a grain boundary of the dielectric layer 22 and the metal film 21 for lower electrode. Thus, characteristics of the metal film 21 for lower electrode and the glue layer 20 are degraded. Since, the volatile components of the dielectric layer 22 are diffused, dielectric characteristic of dielectric layer is degraded.

SUMMARY OF THE INVENTION

Accordingly, it is the object of the present invention to prevent volatile components in the dielectric layer from being diffused into the lower electrode and the glue layer.

It is yet another object of the present invention to secure high dielectric characteristic of dielectric layer in capactor.

To accomplish the object of the present invention in one aspect, the present invention provides a semicondudctor memory device comprising: a single crystalline silicon substrate; a transistor formed at a selected portion of the single crystalline substrate, wherein the transistor comprises a gate electrode, a source region and a drain region; a plug electrically contacted with the source region and formed of a single crystalline epitaxial layer; a lower electrode formed of the single crystalline epitaxial layer contacted to the plug; a dielectric layer formed over the lower electrode and formed of the single crystalline epitaxial layer; and an upper electrode formed over the dielectric layer and formed of the single crystalline epitaxial layer, wherein the dielectric layer is formed of a layer selected among ferroelectric layer, high dielectric layer or pyroelectric layer.

In another aspect, the present invention provides a method for fabricating a semiconductor memory device comprising the steps of: forming source and drain regions at selected portions of a semiconductor substrate in which an active region is defined; forming a plug contacted with the source region by growing the semiconductor substrate according to an epitaxial method; forming a gate electrode between the source and the drain regions; forming a first intermetal insulating layer on the semiconductor substrate; forming a bit line contacted with the drain region by penetrating the first intermetal insulating layer; forming a second intermetal insulating layer on the first intermetal insulating layer in which the bit line is formed; removing the first and the second intermetal insulating layers so as to expose a surface of the plug; growing a glue layer and a conductive layer for lower electrode successively according to epitaxial method by taking the plug as a seed; forming a lower electrode by patterning selected portions of the conductive layer for lower electrode and the glue layer; growing a dielectriclayer and a conductive layer for upper electrode on the lower electrode according to the epitaxial method; and forming an upper electrode by patterning selected portions of the conductive layer for upper layer and the dielectriclayer, wherein the dielectric layer is formed of a layer selected among ferroelectric layer, high dielectric layer or pyroelectric layer.

The present invention further provides a method for fabricating a semiconductor memory device comprising the steps of: forming source and drain regions at selected portions of a semiconductor substrate in which an active region is defined; forming a plug contacted with the source region by growing the semiconductor substrate according to an epitaxial method; forming a gate electrode between the source and the drain regions; forming a first intermetal insulating layer on the semiconductor substrate; forming a bit line contacted with the drain region by penetrating the first intermetal insulating layer; forming a second intermetal insulating layer on the first intermetal insulating layer in which the bit line is formed; polishing the first and the second intermetal insulating layers until a surface of the plug is exposed according to a chemical mechanical polishing process; growing a glue layer and a conductive layer for lower electrode successively according to epitaxial method by taking the plug as a seed; forming a lower electrode by patterning selected portions of the conductive layer for lower electrode and the glue layer; forming a protection layer for surrounding surfaces of the intermetal insulating layers and sidewalls of the glue layer, the lower electrode, the metal oxide type electrode, and simultaneously exposing the surface of the metal oxide type electrode; growing a dielectriclayer and a conductive layer for upper electrode on the lower electrode according to the epitaxial method; and forming an upper electrode by patterning selected portions of the conductive layer for upper layer and the dielectriclayer, wherein the dielectric layer is formed of a layer selected among ferroelectric layer, high dielectric layer or pyroelectric layer.

DETAILED DESCRIPTION OF THE PREFERRED EMBODIMENTS

Figure 1:
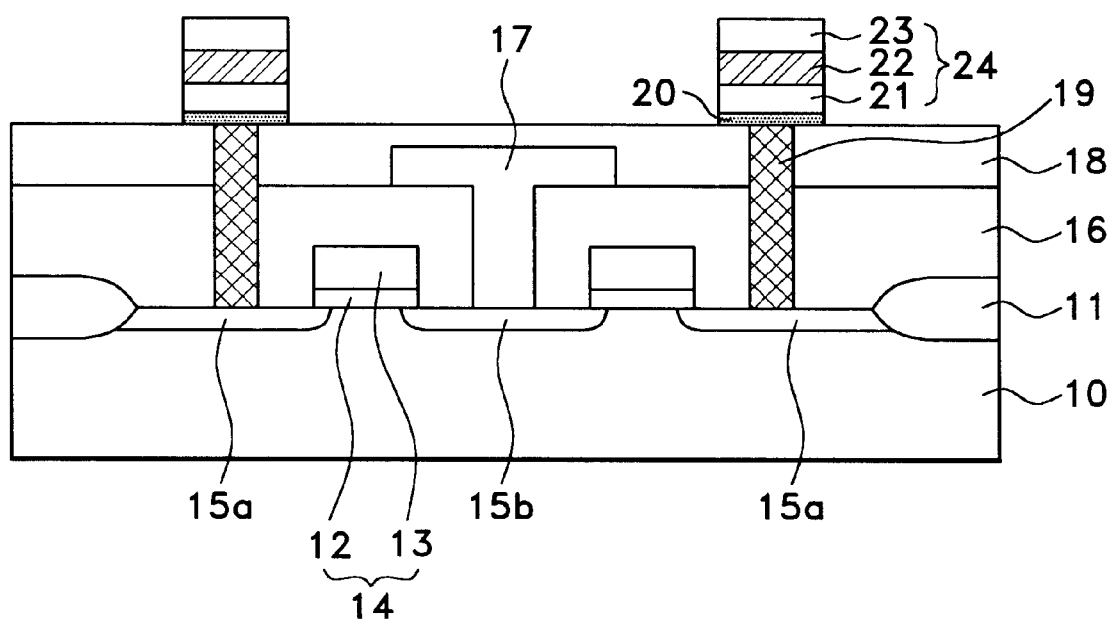
FIG. 1 is a cross-sectional view showing a conventional FeRAM.
Figure 2A:
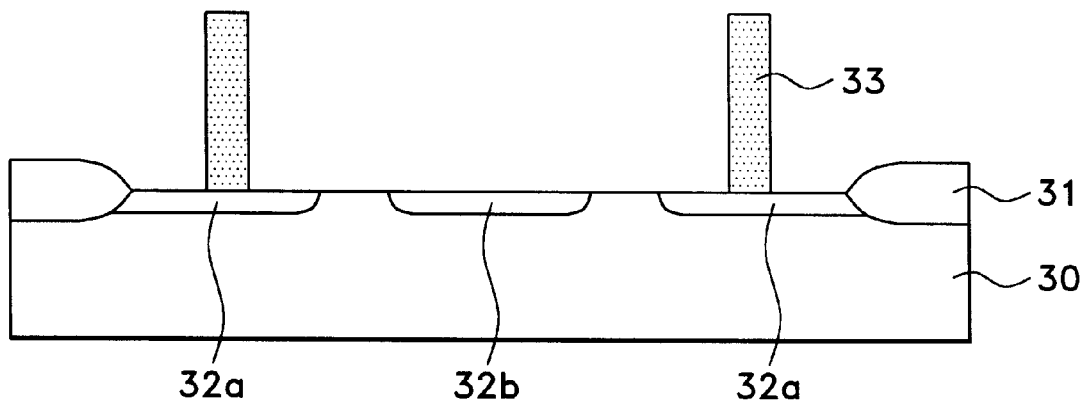
FIGS. 2A to 2F are cross-sectional views for illustrating manufacturing process of semiconductor memory device according to the present invention.

Referring to FIG. 2A, so as to define an active region, a field oxide layer 31 is formed at a selected portion of a semiconductor substrate 30 composed of a single crystalline silicon having predetermined impurities. Source and drain regions 32a, 32b are formed at selected portions of the semiconductor substrate 30. At this time, the source and the drain regions 32a, 32b are impurity regions having a different type from the substrate 30. A surface of the semiconductor substrate 30 is cleaned to remove impurities and process by-products. An epitaxial silicon layer is formed with a selected thickness on the semiconductor substrate 30. The epitaxial silicon layer is preferably formed by a chemical vapor deposition(PVD) method or a physical vapor deposition (PVD) method, and impurities are doped thereon so as to operate as a conductor. At this time, the epitaxial silicon layer has a single crystalline structure since the epitaxial silicon layer is an epitaxial growth layer of the semiconductor substrate 30 composed of single crystalline silicon. Afterward, a selected portion of the epitaxial silicon layer is patterned, and then the portion becomes a contact plug 33 contacted to the source region 32a.

Figure 2B:
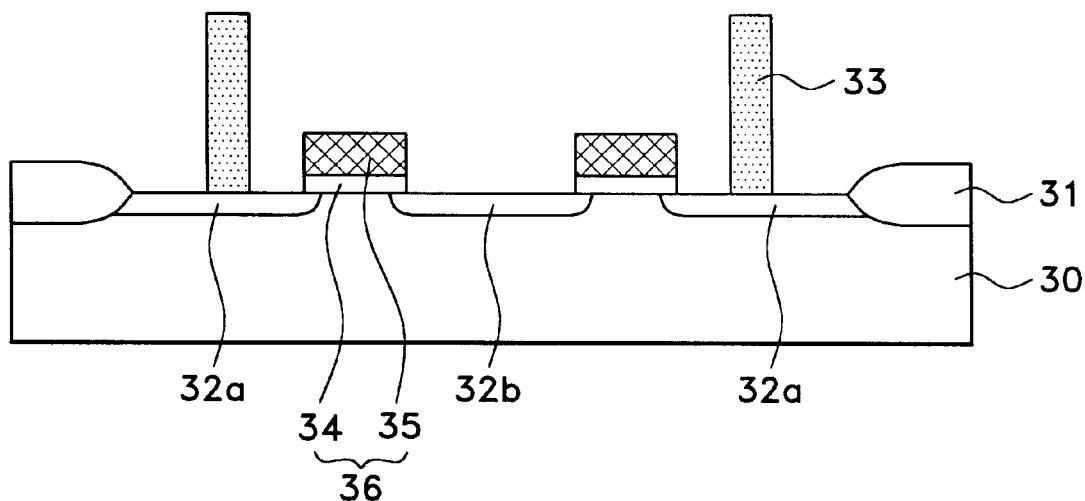

Referring to FIG. 2B, a gate electrode 36 composed of a gate oxide film 34 and a conductive layer 35, is formed between the source region 32a and the drain region 32b thereby forming a transistor. At this time, the conductive layer 35 composing the gate electrode 36 is a doped polysilicon layer.

Figure 2C:
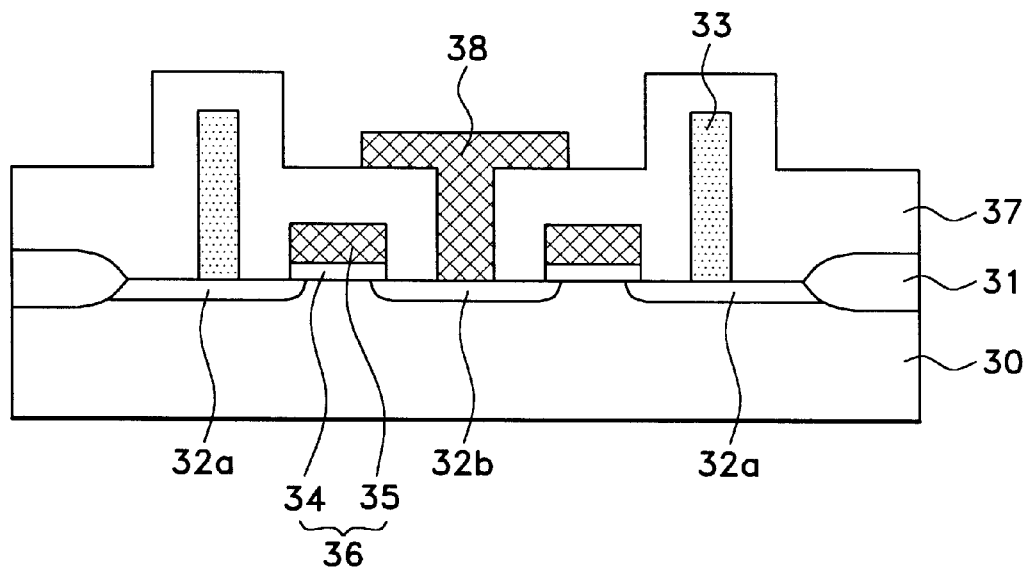

Referring to FIG. 2C, A first intermetal insulating layer 37 is formed on the semiconductor substrate 30 in which the transistor and the plug 33 are formed. Next, the first intermetal insulating layer 37 is etched to expose the drain region 32b. A bit line 38 is formed on the first intermetal insulating layer 37 so as to contact with the exposed drain region 32b.

Figure 2D:
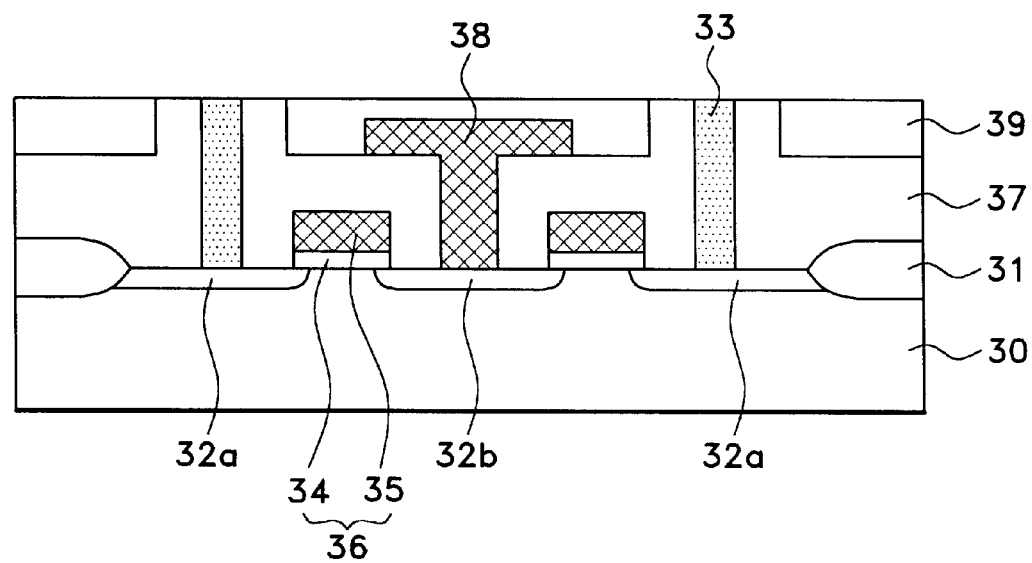

As shown in FIG. 2D, a second intermetal insulating layer 39 is formed on the first intermetal insulating layer 37 in which the bit line 38 is formed. The second intermetal insulating layer 39 and the first intermetal insulating layer 37 are polished according to a chemical mechanical polishing (CMP) process until the surface of the plug 33 made of the epitaxial silicon is exposed. The second intermetal insulating layer 39 should be polished such that the bit line 38 may not exposed during the polishing process. A surface of resultant on the semiconductor substrate 30 is cleaned to remove CMP slurry-residues and process by-products.

Figure 2E:
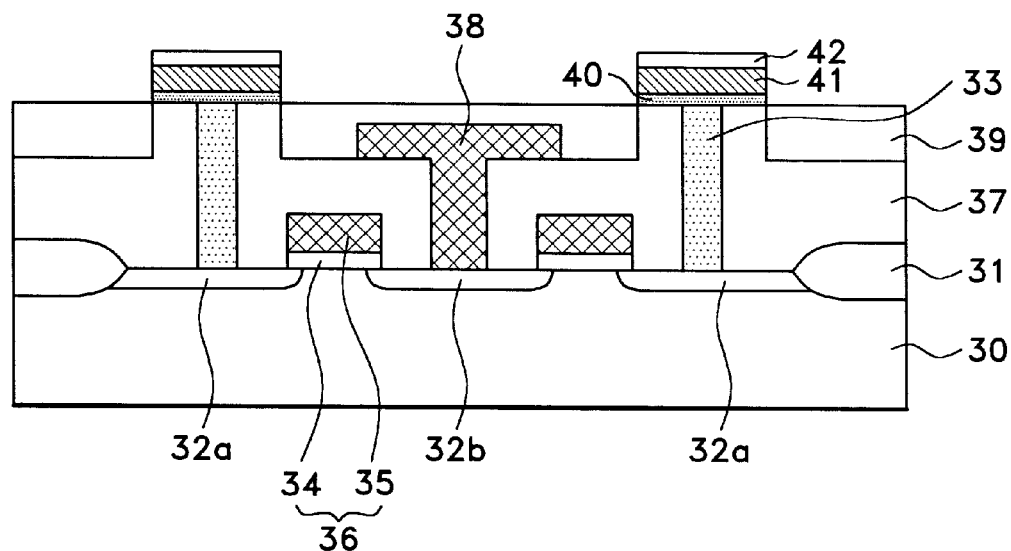

Referring to FIG. 2E, a glue layer 40, a conductive layer for lower electrode and a metal oxide type electrode 42 are grown by epitaxial method successively. Therefore, the glue layer 40, the conductive layer for lower electrode and the metal oxide type electrode 42 have the single crystalline structure. Herein, since the plug 33 is provided as a seed, the glue layer 40, the conductive layer for lower electrode and the metal oxide type electrode 42 can be grown by the epitaxial method. Next, selected portions of the metal oxide type electrode 42, the conductive layer for lower electrode and the glue layer 40 are patterned thereby forming lower electrode 41. Herein, the glue layer is a layer provided for easy connection between the lower electrode 41 and the plug 33, or between the lower electrode 41 and the intermetal insulating layer 37, and the glue layer 40 is formed of Ti, Ta, TiN or TiAlN by thickness of approximately 10~100 nm. The lower electrode 41 is formed of a Pt metal layer, an Ir metal layer or a Pd metal layer by thickness of approximately 100~300 nm. Further, the metal oxide type electrode 42 can be made of, for example an $La_{0.5}Sr_{0.5}CoO_3$ layer or $SrRuO_3$ by thickness of approximately 50~200 according to CVD or PVD method. The metal oxide type electrode 42 is provided so as to form a dielectric layer to be formed later on by the epitaxial method.

Figure 2F:
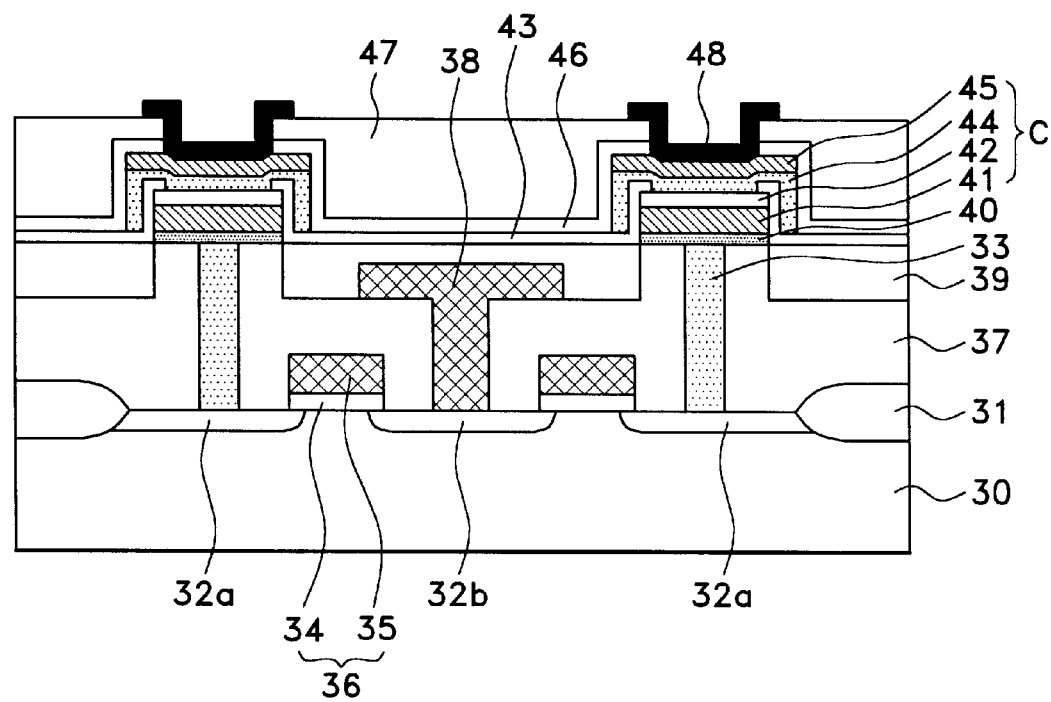

Afterward, referring to FIG. 2F, a protection layer 43 is formed on the surface of resultant on the semiconductor substrate 30. The protection layer 43 can be made of, for example a silicon nitride layer, TEOS-oxide layer, $TiO_2$ or $TiO_2/Si_3N_4$. The protection layer 43 is etched so as to expose a selected portion on a surface of the metal oxide type electrode 42. In subsequent fabricating process of dielectriclayer, since the protection layer 43 surrounds sidewalls of the lower electrode 41 and the glue layer 40, and the protection layer 43 also covers the entire second intermetal insulating layer 39, the sidewalls of the lower electrode 41 and the glue layer 40 can be prevented from being oxidized and diffusion of volatile components in a dielectric layer into the transistor is prevented. By providing the exposed metal oxide type electrode 42 as a seed, a dielectric layer 44 and a conductive layer for upper electrode are formed according to the epitaxial method. Although high temperature is accompanied during fabricating the dielectric layer 44, no lateral diffusion is occurred at the lower electrode 41 and the glue layer 40 because the lower electrode 41 and the glue layer 40 are covered with the protection layer 43. Next, selected portions of the conductive layer for upper electrode and the dielectriclayer 44 are patterned thereby forming an upper electrode 45 and a capacitor insulating layer. Accordingly, there is formed a capacitor C. Herein, SBT layer, PZT layer or BST layer can be used for the dielectric layer 44 and the upper electrode 45 can be formed of the Pt layer, Ir layer or Pd layer as used in the lower electrode 41. At this time, to grow the upper electrode 45 according to the epitaxial method more completely, additional metal oxide type electrode can be sandwiched between the dielectric layer 44 and the upper electrode 45. As the lower electrode 41, the dielectric layer 44 and the upper electrode 45, all consisting the capacitor C are formed of the epitaxial layer, grain boundaries therein are removed. Therefore, the volatile components having oxygen of the dielectric layer 44 can not be diffused into the lower electrode 41 or into the glue layer 40 during depositing the dielectric layer 44. Afterward, a barrier layer 46 and a third intermetal insulating layer 47 are formed on the resultant of the semiconductor substrate 30 in which the capacitor C is formed. The barrier layer 46 is formed of a $TiO_2$ layer or a deposition layer of $TiO_2$ layer and $Si_3N_4$ layer. Herein, to prevent diffusion of hydrogen or $H_2O$ into the dielectric layer 44 during forming the barrier layer 46, the barrier layer 46 is preferably made according to the CVD or the PVD method. When a layer is formed by CVD or PVD method, hydrogen is not generated in CVD or PVD chamber. The third intermetal insulating layer 47 and the barrier layer 46 are patterned so as to expose the upper electrode 45 of the capacitor C. And then, a metal wiring 48 is formed over the third intermetal insulating layer 47 so that the metal wiring 48 is contacted to the exposed upper electrode 45.

As described above in detail, according to the present invention, the plug 33 for electrically connecting the capacitor C and the source region 32a is formed of single epitaxial silicon. By taking the plug 33 as a seed, the lower electrode 41, the dielectriclayer 44 and the upper electrode 45, all for consisting the capacitor C are also formed of the single epitaxial silicon. Therefore, a path for diffusing volatile components or moisture formed when the dielectriclayer 44, the barrier layer 46 or the third intermetal insulating layer 47 are formed, can be blocked up. Accordingly, qualities of the lower electrode and the glue layer 40 can be improved. Furthermore, some components of the dielectric layer 44 are not volatilized thereby improving dielectric property.

While the present invention has been described with reference to certain preferred embodiment, various other modifications will be apparent to and can be readily made by those skilled in the art without departing from the scope and spirit of the present invention.

What is claimed is:

1. A method for fabricating a semiconductor memory device comprising the steps of:
    forming source and drain regions at selected portions of a semiconductor substrate in which an active region is defined;
    forming a plug contacted with the source region by growing the semiconductor substrate according to an epitaxial method;
    forming a gate electrode between the source and the drain regions;
    forming a first intermetal insulating layer on the semiconductor substrate;
    forming a bit line contacted with the drain region by penetrating the first intermetal insulating layer;
    forming a second intermetal insulating layer on the first intermetal insulating layer in which the bit line is formed;
    removing the first and the second intermetal insulating layers so as to expose a surface of the plug;
    growing a glue layer and a conductive layer for lower electrode successively according to epitaxial method by taking the plug as a seed;
    forming a lower electrode by patterning selected portions of the conductive layer for lower electrode and the glue layer;
    growing a dielectric layer and a conductive layer for upper electrode on the lower electrode according to the epitaxial method; and
    forming an upper electrode by patterning selected portions of the conductive layer for upper layer and the dielectric layer;
    wherein the dielectric layer is formed of a layer selected among ferroelectric layer, high dielectric layer of BST or pyroelectric layer.

2. The method of claim 1, further comprising the step of cleaning a surface of the semiconductor substrate, between the steps of forming the source and the drain regions and forming the plug.

3. The method of claim 2, wherein the step of forming the plug further comprises the steps of:
    forming an epitaxial silicon layer comprising impurities by growing the semiconductor substrate by a selected thickness according to the epitaxial method; and
    forming a plug by patterning a selected portion of the epitaxial silicon layer so that the epitaxial silicon layer is contacted with the source region.

4. The method of claim 3, wherein the epitaxial silicon layer is formed according to a chemical vapor deposition method or a physical vapor deposition method.

5. The method of claim 1, wherein the second intermetal insulating layer and the first intermetal insulating layer are polished according to a chemical mechanical polishing process until a surface of the plug is exposed.

6. The method of claim 1, further comprising the step of cleaning the exposed surfaces of the plug and the intermetal insulating layers, between the steps of exposing the plug and forming the glue layer.

7. The method of claim 1, further comprising the step of growing a metal oxide electrode on the conductive layer for lower electrode according to the epitaxial method, between the step of growing the glue layer and the conductive layer for lower electrode according to the epitaxial method, and patterning the same.

8. The method of claim 7, wherein the metal oxide electrode is grown in the epitaxial method according to the chemical vapor deposition method or the physical vapor deposition method.

9. The method of claim 8, wherein the metal oxide electrode is formed of an $La_{0.5}Sr_{0.5}CoO_3$ layer or $SrRuO_3$ layer.

10. The method of claim 1, wherein the glue layer is formed of a layer selected among Ti, Ta, TiN or TiAlN.

11. The method of claim 1, wherein the conductive layer consisting the upper and the lower electrodes are formed of Pt metal layers, Ir layer or Pd layer.

12. The method of claim 7, further comprising the step of forming a protection layer for surrounding upper face of the intermetal insulating layer and sidewalls of the glue layer, the lower electrode, the metal oxide electrode, between the step of forming the lower substrate by patterning selected portions of the conductive layer for lower electrode and the glue layer, and the step of growing the dielectric layer and the conductive layer for upper electrode on the lower electrode according to the epitaxial method.

13. The method of claim 12, wherein the protection layer is a layer selected among $Si_3N_4$, $TiO_2$ or $TiO_2/Si_3N_4$.

14. The method of claim 1, wherein further comprising the step of growing the metal oxide electrode between the dielectric layer and the conductive layer for upper electrode according to the epitaxial method.

15. A method for fabricating a ferroelectric memory device comprising the steps of:
    forming source and drain regions at selected portions of a semiconductor substrate in which an active region is defined;
    forming a plug contacted with the source region by growing the semiconductor substrate according to an epitaxial method;

forming a gate electrode between the source and the drain regions;

forming a first intermetal insulating layer on the semiconductor substrate;

forming a bit line contacted with the drain region by penetrating the first intermetal insulating layer;

forming a second intermetal insulating layer on the first intermetal insulating layer in which the bit line is formed;

polishing the first and the second intermetal insulating layers until a surface of the plug is exposed according to a chemical mechanical polishing process;

growing a glue layer and a conductive layer for lower electrode successively according to epitaxial method by taking the plug as a seed;

forming a lower electrode by patterning selected portions of the conductive layer for lower electrode and the glue layer;

forming a protection layer for surrounding surfaces of the intermetal insulating layers and sidewalls of the glue layer, the lower electrode, the metal oxide electrode, and simultaneously exposing the surface of the metal oxide electrode;

growing a dielectric layer and a conductive layer for upper electrode on the lower electrode according to the epitaxial method; and forming an upper electrode by patterning selected portions of the conductive layer for upper layer and the dielectric layer;

wherein the dielectric layer is formed of a layer selected among ferroelectric layer, high dielectric layer or pyroelectric layer.

16. The method of claim 15, further comprising the step of cleaning a surface of the semiconductor substrate, between the step of forming the source and the drain regions, and the step of forming the plug.

17. The method of claim 16, wherein the step of forming the plug further comprises the steps of:

forming an epitaxial silicon layer comprising impurities by growing the semiconductor substrate by a selected thickness according to the epitaxial method; and forming a plug by patterning a selected portion of the epitaxial silicon layer so that the epitaxial silicon layer is contacted with the source region.

18. The method of claim 15, wherein the epitaxial silicon layer is formed according to a chemical vapor deposition method or a physical vapor deposition method.

19. The method of claim 15, further comprising the step of cleaning the exposed surfaces of the plug and the intermetal insulating layers, between the steps of exposing the plug and forming the glue layer.

20. The method of claim 15, wherein the metal oxide electrode is grown in the epitaxial method according to the chemical vapor deposition method or the physical vapor deposition method.

21. The method of claim 20, wherein the metal oxide electrode is formed of an $La_{0.5}Sr_{0.5}CoO_3$ layer or $SrRuO_3$ layer.

22. The method of claim 15, wherein the glue layer is formed of a layer selected among Ti, Ta, TiN or TiAlN.

23. The method of claim 15, wherein the conductive layer consisting the upper and the lower electrodes are formed of Pt metal layers, Ir layer or Pd layer.

24. The method of claim 15, wherein the protection layer is a layer among $Si_3N_4$, $TiO_2$ or $TiO_2/Si_3N_4$.

* * * * *